United States Patent [19]

Voyce

[11] Patent Number: 4,731,873
[45] Date of Patent: Mar. 15, 1988

[54] SQUELCH TRIGGER CIRCUIT

[75] Inventor: Kenneth G. Voyce, Bellevue, Wash.

[73] Assignee: The Boeing Company, Seattle, Wash.

[21] Appl. No.: 913,843

[22] Filed: Sep. 30, 1986

[51] Int. Cl.⁴ .............................................. H04B 1/10
[52] U.S. Cl. .................................... 455/219; 455/218; 455/222
[58] Field of Search ................ 455/212, 213, 218–225, 455/234, 239, 250

[56] References Cited

U.S. PATENT DOCUMENTS

| | | |
|---|---|---|
| 3,188,571 | 6/1965 | Michael . |
| 3,323,066 | 5/1967 | Kurtz . |
| 3,325,738 | 6/1967 | Busby ................................. 455/219 |
| 3,337,808 | 8/1967 | Kalin ................................... 455/272 |
| 3,569,840 | 3/1971 | Tanaka et al. . |
| 4,041,390 | 8/1977 | Schroeder .......................... 455/219 |
| 4,143,331 | 3/1979 | Page ....................................... 330/2 |
| 4,388,731 | 6/1983 | King .................................... 455/221 |
| 4,411,021 | 10/1983 | Yoakum .............................. 455/222 |
| 4,480,335 | 10/1984 | Kishi ................................... 455/212 |

Primary Examiner—Michael A. Masinick
Attorney, Agent, or Firm—Christensen, O'Connor, Johnson & Kindness

[57] ABSTRACT

A squelch trigger circuit for use in an RF receiver for receiving a modulated carrier signal having a predetermined information band, and producing a squelch trigger signal. The squelch trigger circuit includes a bandpass filter connected to receive the modulated carrier signal and having a passband that includes the information band. The output of the bandpass filter is connected to an AGC circuit that includes a detector for producing a detection signal indicative of the level of the AGC output signal. The detection signal is input to a high pass filter having a corner frequency selected such that the noise signal includes only frequency components higher than one-half of the passband of the bandpass filter, such that the noise signal produced by the high pass filter corresponds to the out of band noise components of the AGC output signal. The noise signal is input to a noise detector for producing a noise level signal, and the noise level signal is compared to a threshold to produce the squelch trigger signal. The threshold may be temperature compensated to model thermal noise in the AGC circuit.

22 Claims, 7 Drawing Figures

SQUELCH TRIGGER CIRCUIT

FIELD OF THE INVENTION

The present invention relates to level sensing circuits in RF receivers and, in particular, to a circuit for generating a temperature stable squelch trigger signal.

BACKGROUND OF THE INVENTION

Squelch circuitry is needed in the receiving section of a high quality RF communication system in order to "squelch" or switch-off what would otherwise be annoying noisy output occuring while the receiver is waiting for a signal to be received. The receiver gain is at its maximum during periods in which no signal is received, and the receiver thus amplifies noise to an unacceptable level during such periods. The basic function of the squelch circuit is to switch-off the output of a receiver when the input signal level is inadequate to provide an intelligible output. This allows a listener to monitor a channel without having to endure long periods of noise output which occurs when no desired signal is being received. When a desired signal is received, its level at the receiver input must be greater than a preset squelch threshold, in order for the squelch circuitry to enable the receiver.

In certain relay link circuits, the squelch circuitry is used to enable a transmitter to retransmit the received signal. For this application, the squelch threshold is set high enough to prevent unwanted triggering of the transmitter from undesired sources such as background signal or noise. The choice of the proper level for the squelch threshold is, however, a compromise. As the threshold is set higher, the receiver range is reduced. Therefore, the optimum choice is that level just above the background signals and noise. If the threshold does not remain constant as the temperature changes, the threshold must be set so that no unwanted trigger occurs even at the worst case temperature. This, however, renders the system less sensitive than it might have been at other temperatures. Minimizing temperature dependence of the squelch trigger is therefore an important goal in the design of an RF receiver or relay link.

The squelch circuitry in a receiver essentially provides an accurate measure of the level of the signal being received. This input signal level can be as low as −107 dBm in some applications, thus requiring approximately 107 dB of gain in order to provide a measurement. This large amount of gain is difficult to stabilize with temperature. It would therefore be a significant advance to provide a method for accurately measuring the receiver's input signal level, without directly relying on the temperature stability of the receiver's gain.

In general, prior squelch control circuits can be divided into a first type that measures signal level at the input of the receiver, and a second type that measures the signal-to-noise ratio at the input of the receiver. In the first type of circuit, the control voltage within an AGC loop may be used as a measure of the input signal level. The biggest problem facing this type of squelch system is accurate measurement of the input signal level. For example, if a squelch circuit were set to trigger on an input signal level of −107 dBm, then 107 dB of stable gain would be required to amplify the signal to the point where it can trigger a comparator. If the trigger point is to remain constant, then all 107 dB of gain must remain constant. This is extremely difficult, because even with temperature compensation, that much gain would vary at least 10 dB over a typical temperature range. Another problem facing the first type of system is that they can be triggered with a pure noise input, if the noise input power reaches the appropriate level. This means that squelch trigger points in such systems must be set high enough so that they do not trigger on even the highest expected input noise level. This, of course, means that the receiver cannot be more sensitive even when the input noise level is low.

The second type of system, to measure signal to noise ratio at the receiver input, must open up the receiver's bandwidth to obtain a sample of "noise only." The wider receiver bandwidth allows extra noise into the circuit all the way to the demodulator. After demodulation, the signal is separated from the extra noise by filters, and a measurement of relative level is made. However, the receiver bandwidth must be wider than the information bandwidth in this type of system, thus rendering the receiver more susceptible to interference. In particular, any signal that appears in the noise measurement band will deactivate the receiver even if a desired signal is also present, unless the desired signal level is significantly greater than the undesired signal level.

SUMMARY OF THE INVENTION

In one aspect, the present invention provides a circuit for receiving a modulated carrier signal having a predetermined information band and for producing an output signal indicating the level of the modulated carrier signal. The circuit comprises a bandpass filter, an AGC circuit, and a trigger circuit. The bandpass filter is connected to receive the modulated carrier signal and to produce a bandpass filtered signal. The bandpass filter has a passband that includes the information band. As a result, substantially all frequency components within the information band of the modulated carrier signal pass through the bandpass filter, but noise frequency components outside the passband are substantially attenuated by the bandpass filter.

The AGC circuit is connected to receive the bandpass filtered signal, and to amplify such signal to produce an IF output signal. The AGC circuit includes an AGC detector connected to receive the IF output signal and to produce a detection signal having a characteristic indicating the level of the IF output signal. The trigger means includes means for receiving the detection signal and means for producing the output signal when the level of noise in the IF output signal outside of the band passed by the bandpass filter crosses a threshold.

The circuit may further include a wideband amplifier connected to receive the modulated carrier signal and to produce an amplified output signal for input into the bandpass filter. The trigger means may include filter means, a noise detector and a comparator. The filter means includes a high pass filter connected to receive the detection signal and to high pass filter the detection signal to produce a noise signal. The corner frequency of the high pass filter is selected such that the noise signal includes only frequency components higher than one-half of the passband of the bandpass filter. The noise signal therefore corresponds to the out of band noise components of the IF output signal. A noise detector is connected to receive the noise signal, and includes means for producing a noise level signal having a characteristic indicative of the level of the noise signal. A comparator compares the noise level signal to the threshold, and produces the output signal when the noise level signal crosses the threshold. The comparator may utilize a threshold signal having a level proportional to the square root of the ambient temperature, to compensate for thermal noise variation in the AGC circuit. The circuit may be used as a squelch trigger circuit in connection with an RF receiver.

DETAILED DESCRIPTION OF THE INVENTION

Figure 1:
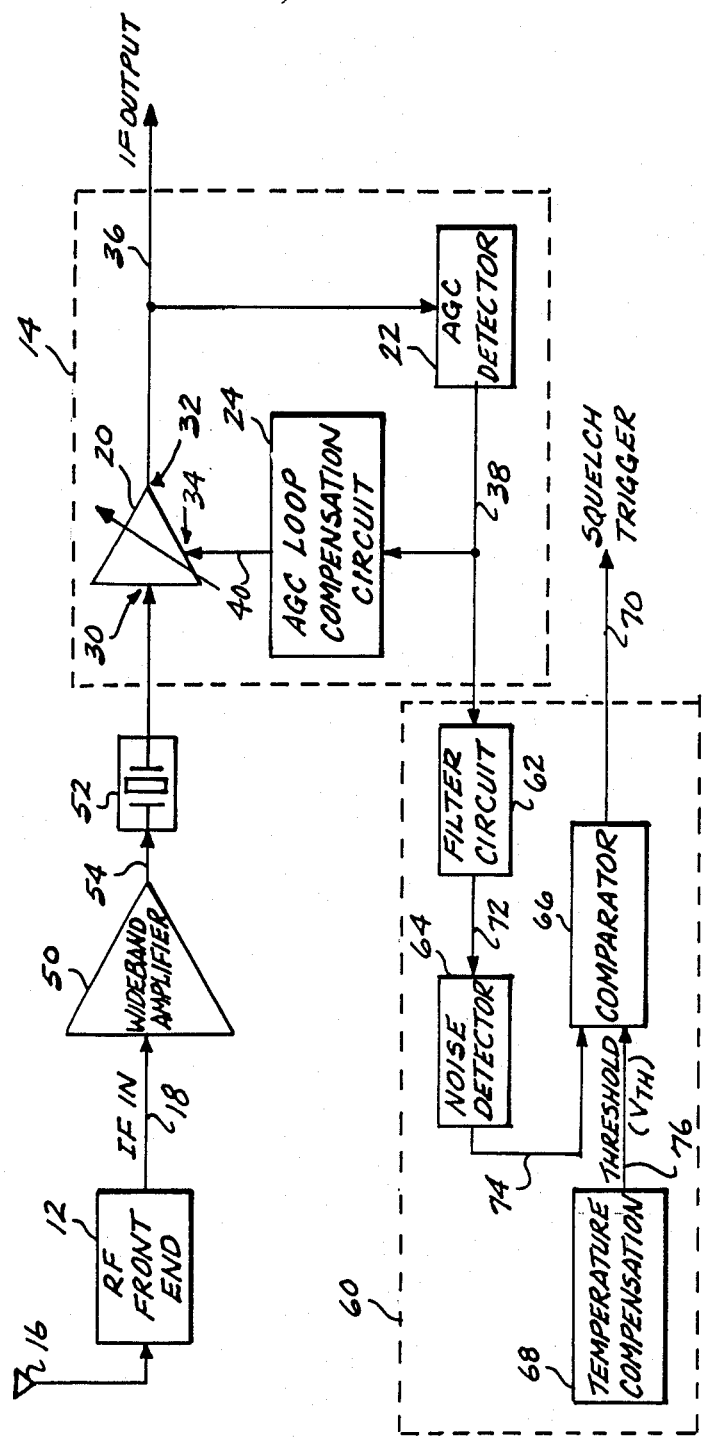
FIG. 1 is a block diagram of a squelch trigger circuit in accordance with the present invention.

FIG. 1 presents a block diagram of a squelch trigger circuit according to the present invention. The squelch trigger circuit is adapted for use in an RF receiver or relay link that includes RF front end 12 and AGC circuit 14. RF front end 12 is adapted to receive a signal from antenna 16, and to produce an IF IN signal on line 18 for input to the AGC circuit. The AGC circuit comprises a tuned gain controllable amplifier 20, an AGC detector 22 and an AGC loop compensation circuit 24. Amplifier 20 includes input terminal 30, output terminal 32 connected to line 36, and control terminal 34 connected to line 40. The amplifier amplifies the signal received at input terminal 30 by a variable amount to produce an amplified IF output signal on line 36. The variable amount of amplification is set by means of a control signal applied to control terminal 34 via line 40. The control signal is derived by means of AGC detector 22 and AGC loop compensation circuit 24. AGC detector 22 detects the voltage or power level of the IF output signal on line 36, and provides a corresponding correction signal on line 38 that is input to the AGC loop compensation circuit. The compensation circuit responds by producing a control signal on line 40 that adjusts the gain of amplifier 20 so as to produce a predetermined power or voltage level on line 36.

In accordance with the present invention, wideband amplifier 50 and narrow band crystal filter 52 are connected between RF front end 12 and AGC circuit 14, and trigger circuit 60 is connected to receive the correction signal produced by AGC detector 22 on line 38. Trigger circuit 60 includes filter circuit 62, noise detector 64, comparator 66 and temperature compensation circuit 68. Wideband amplifier 50 applies a fixed amount of gain to the IF IN signal on line 18 to produce an amplified IF signal on line 54 that is input to crystal filter 52. Crystal filter 52 has a narrow passband that is centered about and that includes the information band of the IF IN signal. As a result of crystal filter 52, noise components of the signal applied to input terminal 30 of amplifier 20 outside the crystal filter's bandwidth are greatly attenuated. As a result, any noise components in the IF output signal on line 36 outside this bandwidth represent noise introduced by amplifier 20. The significance of this fact will be described below. In the following description, the term "out of band noise" will be used to refer to noise outside the bandwidth of crystal filter 52.

The correction signal produced by AGC detector 22 is input to filter circuit 62 of trigger circuit 60. Filter circuit 62 includes a high pass filter that removes the low frequency components of the correction signal, and produces a noise signal on line 72 that represents only the out of band noise introduced by amplifier 20. The level of this noise is detected by noise detector 64, and the noise detector produces a noise level signal on line 74 that forms one input of comparator 66. The other input of comparator 66 is a threshold signal on line 76 produced by temperature compensation circuit 68. The temperature compensation circuit will be further described below. Comparator 66 produces a squelch trigger signal on line 70 whenever the noise level signal on line 74 crosses the threshold, i.e., exceeds the threshold in either a positive or negative going direction.

Figure 2C:
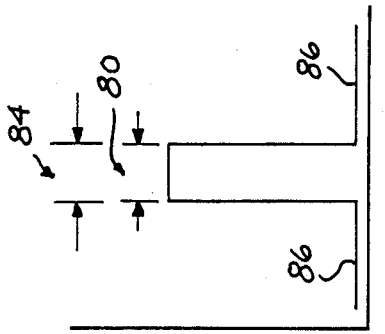
FIGS. 2a-2f are graphs schematically illustrating the frequency spectrum of signals at different points in the block diagram of FIG. 1.
Figure 2F:
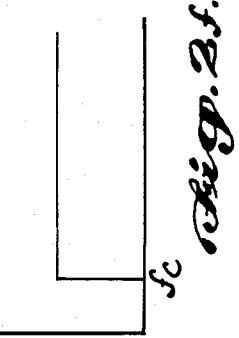

The operation of the circuit shown in FIG. 1 can be described with reference to the schematic sketches in FIGS. 2a-2f. FIG. 2a graphically represents the frequency spectrum of a hypothetical IF IN signal on line 18. The IF IN signal includes information band 80 that includes the IF carrier signal and any modulation produced by information signals imposed on the IF carrier signal. The IF IN signal also includes noise at noise level 82 at frequencies above and below the information band.

Figure 2B:
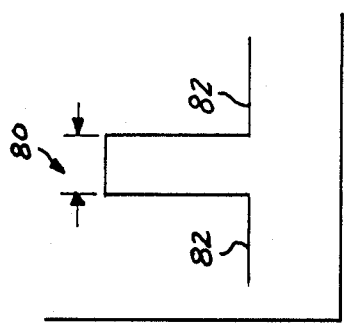

FIG. 2b illustrates the frequency spectrum of the amplified IF signal produced by wideband amplifier 50 on line 54. The wideband amplifier essentially provides a uniform gain across the spectrum shown in FIG. 2a, to produce the frequency spectrum shown in FIG. 2b, in which both information band 80 and noise level 82 have been uniformly amplified. FIG. 2c shows the result of passing the amplified IF signal on line 54 through crystal filter 52. The crystal filter has a passband 84 that includes information band 80 of the IF IN signal. Preferably, passband 84 is selected to be equal to information band 80, as shown in FIG. 2c, so that the ability of the circuit to reject out of band interference is enhanced. Thus crystal filter 52 passes the information band essentially without attenuation, but significantly attenuates all signals outside of passband 84. As a result, the level 86 of out of band noise is significantly attenuated.

Figure 2E:
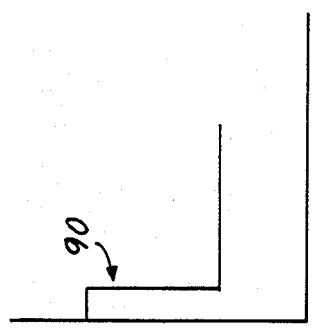
Figure 2A:
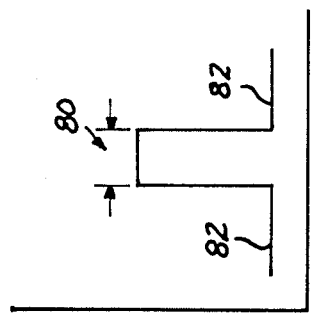
Figure 2D:
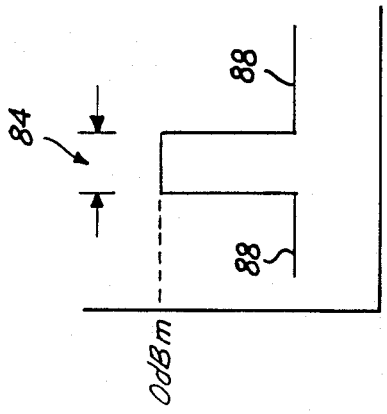

FIG. 2d illustrates the frequency spectrum of the IF output signal on line 36. Amplifier 20 amplifies the signal at input terminal 30 (FIG. 2c), such that the average power of the signal is at a prescribed level, such as 0 dBm. FIG. 2d illustrates that the components within passband 84 are uniformly amplified by the AGC circuit, such that the peak power in the information band is at the prescribed 0 dBm level. In FIG. 2d, noise level 88 outside of passband 84 has also increased, due to noise introduced by amplifier 20. The level 88 of this out of band noise is an accurate measure of the gain applied by amplifier 20. The gain applied by amplifier 20 is in turn a measure of the level of the IF IN signal. Thus the level of noise level 88 provides an accurate measure of the level of the input signal. Furthermore, the only temperature dependencies of out of band noise level 88 are that due to the variation of thermal noise within amplifier 20 with temperature, that due to variation of insertion loss with temperature of crystal filter 52, and that due to variation of the gain applied by wideband amplifier 50. The latter can be largely eliminated by implementing wideband amplifier 50 as a feedback amplifier, to produce a uniform gain regardless of temperature. Variation of the insertion loss of crystal filter 52 can be readily minimized by using a temperature compensated filter. Variation of thermal noise of amplifier 50 with temperature is easily modeled, as described below.

FIG. 2e illustrates the frequency spectrum of the output of AGC detector 22. In effect, the AGC detector folds the graph of FIG. 2d about its center frequency, and shifts the graph to the origin. This signal is input to filter circuit 62 that includes a high pass filter having a corner frequency $f_c$, the corner frequency being selected such that it is higher than one-half of the passband 84 of crystal filter 52. As a result, the portion 90 of the frequency spectrum shown in FIG. 2e is blocked by filter circuit 62, resulting in the frequency spectrum shown in FIG. 2f that contains only components higher than $f_c$. Filter circuit 62 may further include a low pass filter having a corner frequency higher than $f_c$, in order to limit the high frequency components of the noise signal on line 72.

Noise detector 64 measures the level of the noise signal shown in FIG. 2f, to produce a noise level signal on line 74. The noise level signal is thus an accurate measure of the out of band noise components of the IF output signal on line 36. This noise level signal is compared with a threshold signal $V_{TH}$ produced on line 76 by temperature compensation circuit 68. The temperature compensation circuit varies the voltage level $V_{TH}$ in accordance with the following formula:

$$V_{TH} = V_o \sqrt{\frac{T}{293}}$$

where T is the temperature in degrees Kelvin and $V_o$ is the threshold voltage at room temperature. As a result, the level of the threshold signal varies with the expected level of thermal noise from amplifier 20. The squelch trigger signal produced by comparator 66 is thus almost entirely independent of the temperature of the circuit.

It can be seen from the above that the temperature dependence of the gain control characteristic of amplifier 20 does not affect the noise level signal on line 74. However, the out of loop gain provided by wideband amplifier 50 does affect such noise. For this reason, wideband amplifier 50 is preferably a feedback amplifier adapted to produce a very stable amount of gain. The principal purpose of the wideband amplifier is to provide a higher signal to noise ratio for the signal input to crystal filter 52. However the wideband amplifier is not strictly speaking necessary for the practice of the present invention, and may be omitted if desired. The technique of the present invention offers a more accurate measure of input signal level, because it essentially measures the gain required to bring the signal up to a known level.

In an embodiment of the present invention used in a relay link, the frequency spectrum of the IF IN signal had a center frequency of 70 MHz with an information band 80 of approximately 70 KHz. The corner frequency $f_c$ of high pass filter 62 was 200 KHz, and an additional low pass filter was provided with a 1 MHz corner frequency. Passband 84 was selected to be 70 KHz, and a gain of 18 dB was selected for wideband amplifier 50. In such a circuit, with AGC 14 adapted to produce an IF output signal at 0 dBm, a circuit was capable of accurately sensing signals as low as −107 dBm. The squelch accuracy was +1.5 dB −0 dB over a temperature range of −20° C. to +60° C.

The amount of gain applied by wideband amplifier 50 should be kept small compared with the amount of gain provided by AGC circuit 14. As a result, most of the gain will occur after the signal has passed through the narrow band crystal filter 52, which in turn will make it possible to obtain a measure of gain by looking at the out of band noise, i.e., the output of amplifier 20 that did not come through the crystal filter. A measure of this amplified noise is an accurate indication of the amount of gain. Once the gain has been measured, the input signal level is known, because the AGC loop maintains the output level constant. Crystal filter 52 greatly attenuates any interference which might otherwise reach the noise measurement band, thereby providing a significant improvement over prior art approaches that measure signal to noise ratio.

While the preferred embodiments of the invention have been illustrated and described, it is to be understood that variations will be apparent to those skilled in the art. Accordingly, the invention is not to be limited to these specific embodiments illustrated and described and the true scope of the invention is to be determined by reference to the following claims.

The embodiments of the invention in which an exclusive property or privilege is claimed are defined as follows:

1. A circuit for receiving a modulated carrier signal having a predetermined information band and producing an output signal indicative of the level of the modulated carrier signal, the circuit comprising:
   a bandpass filter connected to receive the modulated carrier signal and to produce a bandpass filtered signal, the bandpass filter having a passband that includes the information band, whereby substantially all frequency components within the information band of the modulated carrier signal pass through the bandpass filter, but noise components having frequencies outside the passband are substantially attenuated by the bandpass filter;
   an AGC circuit connected to receive the bandpass filtered signal and to amplify the bandpass filtered signal to produce an IF output signal having a noise component that is outside of the band passed by the bandpass filter, the level of the noise component being directly proportional to the gain of the AGC circuit and thus inversely proportional to the level of the modulated carrier signal, the AGC circuit including an AGC detector connected to receive the IF output signal and to produce a detection signal having a characteristic indicative of the level of the IF output signal; and
   a trigger circuit including means for receiving the detection signal and means for producing the output signal when the level of the noise component in the IF output signal crosses a threshold.

2. The circuit of claim 1, further comprising a wideband amplifier connected to receive the modulated carrier signal and to produce an amplified output signal for input into the bandpass filter, the bandwidth of the wideband amplifier being greater than or equal to the passband of the bandpass filter.

3. The circuit of claim 2, wherein the bandpass filter comprises a crystal filter.

4. The circuit of claim 1, wherein the trigger circuit comprises a noise level circuit including means for receiving the detection signal and for producing a noise level signal indicative of the level of the noise component in the IF output signal outside of the band passed by the bandpass filter, and a comparator for comparing the noise level signal to a threshold and for producing the output signal when the noise level signal exceeds the threshold.

5. The circuit of claim 4, further comprising a wideband amplifier connected to receive the modulated carrier signal and to produce an amplified output signal for input into the bandpass filter, the bandwidth of the wideband amplifier being greater than or equal to the passband of the bandpass filter.

6. The circuit of claim 4, wherein the comparator compares the noise level signal to a threshold signal having a level proportional to the square root of the ambient temperature in degrees Kelvin.

7. The circuit of claim 4, wherein the noise level circuit comprises filter means including a high pass filter having a corner frequency and connected to receive the detection signal and to high pass filter the detection signal to produce a noise signal, the corner frequency being selected such that the noise signal includes only frequency components higher than one-half of the passband of the bandpass filter, whereby the noise signal corresponds to the out of band noise components of the IF output signal, and a noise detector connected to receive the noise signal and including means for producing the noise level signal such that the noise level signal has a characteristic indicative of the level of the noise signal.

8. The circuit of claim 7, further comprising a wideband amplifier connected to receive the modulated carrier signal and to produce an amplified output signal for input into the bandpass filter, the bandwidth of the wideband amplifier being greater than or equal to the passband of the bandpass filter.

9. The circuit of claim 7, wherein the filter means further comprises a low pass filter having a second corner frequency greater than the corner frequency of the high pass filter, to thereby establish the upper frequency limit of the noise signal.

10. The circuit of claim 7, wherein the comparator compares the noise level signal to a threshold signal having a level proportional to the square root of the ambient temperature in degrees Kelvin.

11. The circuit of claim 1, wherein the passband is substantially equal to the information band, whereby the susceptibility of the circuit to out of band interference is decreased.

12. A circuit for use in an RF receiver for receiving a modulated carrier signal having a predetermined information band and producing a squelch trigger signal, the receiver including an AGC circuit including an input terminal and means for receiving an input signal at the input terminal and amplifying the input signal to produce an IF output signal having a noise component that is outside of the information band, the level of the noise component being directly proportional to the gain of the AGC circuit and thus inversely proportional to the level of the modulated carrier signal, the AGC circuit including an AGC detector connected to receive the IF output signal and to produce a detection signal having a characteristic indicative of the level of the IF output signal, the circuit comprising:

a bandpass filter connected to receive the modulated carrier signal and to produce a bandpass filtered signal, the bandpass filter having a passband that includes the information band, whereby substantially all frequency components within the information band of the modulated carrier signal pass through the bandpass filter, but noise components having frequencies outside the passband are substantially attenuated by the bandpass filter;

means connecting the bandpass filtered signal to the input terminal of the AGC circuit; and a trigger circuit including means for receiving the detection signal and means for producing the squelch trigger signal when the level of the noise component in the IF output signal outside of the band passed by the bandpass filter crosses a threshold.

13. The circuit of claim 12, further comprising a wideband amplifier connected to receive the modulated carrier signal and to produce an amplified output signal for input into the bandpass filter, the bandwidth of the wideband amplifier being greater than or equal to the passband of the bandpass filter.

14. The circuit of claim 13, wherein the bandpass filter comprises a crystal filter.

15. The circuit of claim 12, wherein the trigger circuit comprises a noise level circuit including means for receiving the detection signal and for producing a noise level signal indicative of the level of the noise component in the IF output signal outside of the band passed by the bandpass filter, and a comparator for comparing the noise level signal to a threshold and for producing the output signal when the noise level signal exceeds the threshold.

16. The circuit of claim 15, further comprising a wideband amplifier connected to receive the modulated carrier signal and to produce an amplified output signal for input into the bandpass filter, the bandwidth of the wideband amplifier being greater than or equal to the passband of the bandpass filter.

17. The circuit of claim 15, wherein the comparator compares the noise level signal to a threshold signal having a level proportional to the square root of the ambient temperature in degrees Kelvin.

18. The circuit of claim 15, wherein the noise level circuit comprises filter means including a high pass filter having a corner frequency and connected to receive the detection signal and to high pass filter the detection signal to produce a noise signal, the corner frequency being selected such that the noise signal includes only frequency components higher than one-half of the passband of the bandpass filter, whereby the noise signal corresponds to the out of band noise components of the IF output signal, and a noise detector connected to receive the noise signal and including means for producing the noise level signal such that the noise level signal has a characteristic indicative of the level of the noise signal.

19. The circuit of claim 18, further comprising a wideband amplifier connected to receive the modulated carrier signal and to produce an amplified output signal for input into the bandpass filter, the bandwidth of the wideband amplifier being greater than or equal to the passband of the bandpass filter.

20. The circuit of claim 18, wherein the filter means further comprises a low pass filter having a second corner frequency greater than the corner frequency of the high pass filter, to thereby establish the upper frequency limit of the noise signal.

21. The circuit of claim 18, wherein the comparator compares the noise level signal to a threshold signal having a level proportional to the square root of the ambient temperature in degrees Kelvin.

22. The circuit of claim 12, wherein the passband is substantially equal to the information band, whereby the susceptibility of the circuit to out of band interference is decreased.

* * * * *